US007746089B2

(12) United States Patent
Hobbs et al.

(10) Patent No.: US 7,746,089 B2
(45) Date of Patent: Jun. 29, 2010

(54) METHOD AND APPARATUS FOR INDIRECT PLANARIZATION

(75) Inventors: Eric D. Hobbs, Livermore, CA (US); Alexander H. Slocum, Bow, NH (US)

(73) Assignee: FormFactor, Inc., Livermore, CA (US)

(*) Notice: Subject to any disclaimer, the term of this patent is extended or adjusted under 35 U.S.C. 154(b) by 334 days.

(21) Appl. No.: 11/537,164

(22) Filed: Sep. 29, 2006

(65) Prior Publication Data

US 2008/0079449 A1 Apr. 3, 2008

(51) Int. Cl.
*G01R 31/02* (2006.01)

(52) U.S. Cl. ...................................................... 324/754

(58) Field of Classification Search ................. 324/765, 324/754, 761–762, 158.1; 438/14–18
See application file for complete search history.

(56) References Cited

U.S. PATENT DOCUMENTS 6,703,853 B1 * 3/2004 Wee et al. ................... 324/755
6,734,690 B1 * 5/2004 Ashby ........................ 324/761
7,061,257 B2 6/2006 Khandros et al.
7,074,072 B2 7/2006 Huebner
7,098,650 B2 * 8/2006 Foster et al. ............. 324/158.1
7,368,930 B2 * 5/2008 Hobbs et al. ................ 324/758
2003/0102878 A1 6/2003 Montoya
2005/0194983 A1 9/2005 Schwindt et al.

OTHER PUBLICATIONS

International Search Report and Written Opinion mailed Sep. 22, 2008 for PCT Application No. PCT/US07/79612.

* cited by examiner

*Primary Examiner*—Ha Tran T Nguyen
*Assistant Examiner*—Tung X Nguyen
(74) *Attorney, Agent, or Firm*—N. Kenneth Burraston

(57) ABSTRACT

Methods and apparatus for indirect planarization of a substrate are provided herein. In one embodiment, an apparatus for indirectly planarizing a probe card assembly includes an adjustment portion for controlling a force applied to a probe substrate of the probe card assembly; a force application portion configured to apply the force to the probe substrate at a location that is laterally offset from the adjustment portion; and a mechanism coupling the adjustment portion to the force application portion.

43 Claims, 6 Drawing Sheets

100 112 103 102 116 116 118 104 114 162 152 160 120 122 121 164 138 154 150 136 108 140 134 106 132 124 126 CPU SUPPORT CIRCUIT MEMORY S/W 128 110 130

116
120
122
204
412
410
414
407
406
404
408
426
430
428
202
118
400
402
405
434
422
416
438
424
423
418
432
420
436
104

METHOD AND APPARATUS FOR INDIRECT PLANARIZATION

BACKGROUND OF THE INVENTION

1. Field of the Invention

Embodiments of the present invention generally relate to methods and apparatus for indirectly planarizing a substrate. More specifically, embodiments of the present invention generally relate to methods and apparatus for indirectly planarizing a substrate in a semiconductor substrate test system.

2. Description of the Related Art

Testing and/or burning in of semiconductor substrates having completed or partially completed devices formed thereon is an important part of the fabrication sequence for creating semiconductor devices (such as integrated circuits). Test systems developed to test and/or burn in these devices are generally expensive and are designed to test devices on substrates in standard sizes, such as 200 or 300 millimeter semiconductor wafers. Moreover, conventional test systems generally have a limited physical space for respective components of the system due to the space limitation within the fabrication/testing facility as well as within the physical footprint of the test system itself. For example, a component of the test system, such as a probe card for contacting the device under test (DUT) must fit within an assigned area in order to not interfere with other components of the system or their functionality, accessibility, and the like. Accordingly, test systems designed for testing one size substrate may not be able to test larger substrates due to the larger substrate not fitting in the test system, and/or due to the test system being unable to test locations of the larger substrate that lie outside of the test area of the system.

As substrates continue increasing in size to improve yields and push down fabrication costs for producing integrated circuits, existing test systems will more frequently run into physical limitations in their design that do not allow these conventional systems to test a particular wafer.

Therefore, there is a need for a method and apparatus for expanding the range over which a probe card may be utilized in a test system.

SUMMARY OF THE INVENTION

Methods and apparatus for indirect planarization of a substrate are provided herein. In one embodiment, an apparatus for indirectly planarizing a probe card assembly includes an adjustment portion for controlling a force applied to a probe substrate of the probe card assembly; a force application portion configured to apply the force to the probe substrate at a location that is laterally offset from the adjustment portion; and a mechanism coupling the adjustment portion to the force application portion.

In another embodiment of the invention, an apparatus for indirectly planarizing a probe card assembly includes a base for coupling the apparatus to a reference location; a mechanism coupled to the base and having a force application portion proximate a first end of the mechanism; and an adjustment portion for controlling the displacement of the force application portion with respect to the reference location.

In another embodiment of the invention, a probe card assembly for testing a semiconductor is provided. In one embodiment, the probe card assembly includes an upper portion configured to interface with a tester, the upper portion sized to fit within an interior area of the tester defined and bounded by a keepout area; a lower portion coupled to the upper portion and having a probe interface disposed on a bottom surface of the lower portion, the lower portion larger than the interior area defined by the keepout; and an offset adjuster for planarizing the bottom surface of the lower portion, wherein the offset adjuster includes an adjustment portion having access from the upper portion within the interior area; and a force application portion that applies a force in response to control of the adjustment portion.

In another embodiment of the invention, a probe card assembly for testing a semiconductor includes an upper portion configured to interface with a tester, the upper portion sized to fit within an interior area of the tester defined and bounded by a keepout area; a lower portion coupled to the upper portion and having a probe interface disposed on a bottom surface of the lower portion, the lower portion larger than the interior area defined by the keepout; and an offset adjuster for planarizing the bottom surface of the lower portion, wherein the offset adjuster extends from within the interior area to a region below the keepout area.

In another aspect of the invention, a method of using a probe card assembly is provided. In one embodiment, the method of using includes providing a probe card assembly having a probe substrate and at least one offset adjuster, wherein the probe substrate includes a probe surface and an opposing back surface and the offset adjuster includes an adjustment portion and a force application portion laterally offset from the adjustment portion, and wherein the force application portion directly or indirectly contacts the back surface of the probe substrate; and adjusting the offset adjuster to apply a force to the back surface of the probe substrate.

BRIEF DESCRIPTION OF THE DRAWINGS

So that the manner in which the above-recited features of the present invention and others described below can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images used in the drawings are simplified for illustrative purposes and are not necessarily depicted to scale.

DETAILED DESCRIPTION

The present invention provides methods and apparatus for adjusting the planarity of a probe substrate on a probe card assembly for use in testing at least partially completed semiconductor devices formed on a semiconductor substrate. The inventive methods and apparatus disclosed herein advantageously allow for devices to be tested that are dimensionally too large to be tested utilizing conventional testing systems. Moreover, the inventive methods and apparatus advantageously allow for retrofit or modification of conventional test systems to allow testing of larger substrates utilizing existing equipment, thereby expanding testing capabilities at a greatly reduced cost.

Figure 1:
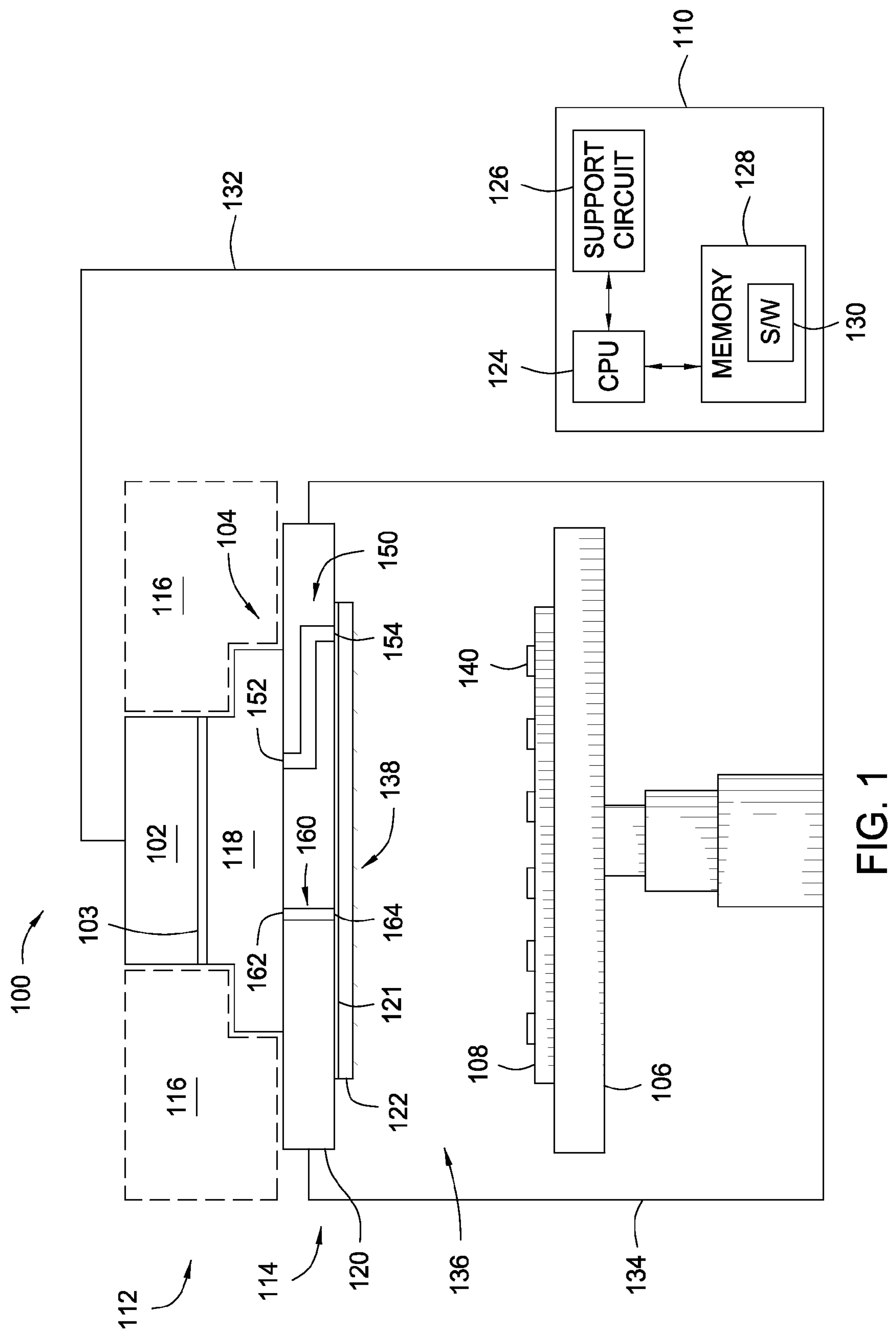
FIG. 1 is a schematic representation of a testing system having a probe card utilizing the offset adjuster according to some embodiments of the present invention.

FIG. 1 illustrates an exemplary test system 100 utilizing an offset adjuster according to embodiments of the invention for testing a device under test (DUT) 108. The DUT 108 may be any electronic device or devices being tested or to be tested. Non-limiting examples of DUTs include one or more dies of an unsingulated semiconductor wafer, one or more semiconductor dies singulated from a wafer (packaged or unpackaged), one or more dies of a plurality of singulated semiconductor dies disposed in a carrier or other holding device, one or more multi-die electronics modules, one or more printed circuit boards, and any other type of electronic device or devices suitable for testing within the test system 100 as described herein.

The test system 100 generally includes a test head 102 coupled to a probe card assembly 104, a support chuck 106 for supporting a device under test (DUT) 108 beneath the probe card assembly 104, and a controller, 110 for controlling the operation of the test system 100. The above components of the test system 100 are generally arranged about a housing 134 (e.g., a test apparatus, such as a semiconductor prober) having an interior chamber 136. The housing 134 generally provides a structure to support, contain, and/or relatively position the various components of the test system 100. The housing 134 shown in FIG. 1 is illustrative only and may have other geometries, for example, such as enclosing the entire test system 100.

The test system 100 further comprises an upper region 112, generally disposed above the probe card assembly 104, and a lower region 114, generally disposed at or below the probe card assembly 104. The upper region 112 includes a keep out area 116 that is generally defined by the manufacturer or operator of the test system 100. As defined with respect to the probe card assembly 104, the keep out area 116 is a region of the test system 100 where the probe card assembly 104 cannot intrude, due to the presence of other equipment in the keep out area 116, or the need for access to other equipment via the keep out area 116. The presence and geometry of the keep out area 116 is a critical factor in the design and operation of the probe card assembly 104, as a probe card assembly 104 that does not conform to the keep out requirements will not be usable in the test system 100.

The probe card assembly 104 includes a plurality of electrically conductive probes 138 for contacting specific sites on the DUT 108 (e.g., input and/or output terminals 140 of the DUT 130). The probes 138 are generally disposed in an array or other pattern suitable for contacting some or all of the terminals 140 of the DUT 108. As shown in FIG. 1, the probe card assembly 104 may be coupled to the housing 134 and held in position above the support chuck 106, for example by being attached (e.g., bolted, clamped, or the like) to an insert ring, card holder, or similar structure (not shown) of the housing 134 having an opening through which the probes 138 can extend into the chamber 136. Electrical signals provided to and read from the probes 138 are electrically coupled through the probe card assembly 104 to the test head 102, and ultimately, to the controller 110 via the communications channels 132. A plurality of electrically conductive paths can thus be provided between the controller 110, the test head 102, and the probes 116.

According to some embodiments, the probe card assembly 104 may comprise one or more substrates, including one or more probe substrates having the plurality of probes 138 extending from a bottom surface thereof. A probe substrate 122 may be coupled to a wiring substrate 120 that supports the probe substrate 122 and provides an electrical signal pathway from the probes 138 to the test head 102. Optionally, one or more additional substrates, such as a substrate 118 may be provided. The substrate 118 may comprise one or more of an aligner plate for laterally aligning the probe substrate 122 in a desired position, a stiffener for stiffening the probe card assembly 104, and the like. For example, in one embodiment, the probe card assembly 104 may comprise both a stiffener and an aligner plate. In some embodiments, the probes 138 may be mechanically connected with the aligner plate, for example via one or more probe substrates 122, such that lateral movement of one of the probes 138 will cause all of the probes 138 to move in a lateral direction. Alternatively, the probe substrate 122 may be laterally aligned by other means, such as through alignment of the wiring substrate 120 or any other suitable manner of lateral alignment.

In addition to lateral alignment, the probe substrate 122 is also planarized with respect to the DUT 108. Planarization of the probe substrate 122 is the height positioning of the tips of the probes 138 with respect to each other. A probe card assembly 104 is considered planarized when all probes 138 are within a selected tolerance. In usage, planarization assists in making electrical contact within a specified amount of overtravel between the first and last of the probes 138 to make contact with the respective terminals 140 of the DUT 108. Theoretically, a probe card is in perfect planarization if all probes make electrical contact at precisely the same time. In one embodiment, the probe card assembly 104 is considered to be in planarization if the respective tips of the plurality of probes are within a predefined expected surface variation of the wafer fabrication processes. In one embodiment, the probe card assembly 104 is considered to be in planarization if no more than 1.0 mil of overtravel exists between the first and last of the probes to make contact with the terminals of the DUT. In one embodiment, the probe card assembly 104 is considered to be in planarization if the respective tips of the plurality of probes are within 30 μm to the terminals of the DUT.

The probes 138 may be planarized by selectively applying one or more independently controllable forces to various locations of the probe substrate 122. Accordingly, a plurality of adjusters can be provided at various locations along the probe substrate 122. Each adjuster is suitable for applying a force of up to about 200 pounds. As illustratively shown in FIG. 1, each adjuster may be an offset adjuster 150 or an axial adjuster 160.

Each offset adjuster 150 has a force adjustment portion 152 that is laterally offset from a force application portion 154 such that an adjustment to the force applied to the probe substrate 122 at a particular location is laterally offset with the location where the adjustment is made. As used herein, the terms "offset" and "laterally offset" refer to the relative positions of the force adjustment portion and the force application portion along an axis passing through the force application portion in a direction substantially perpendicular to a plane defined by, for example a probe card assembly or the surface of a DUT. As such, it is contemplated that the force application portion and the force adjustment portions may be axially aligned but disposed at an angle within a probe card assembly or with respect to the surface of the DUT. The offset adjusters 150 are generally positioned in locations where it would be impractical to utilize an axial adjuster 160 to planarize the probe substrate 122. For example, an offset adjuster 150 may be utilized to apply a planarizing force to the probe substrate in a region proximate the keepout area 116 or in other regions where axial alignment of force adjustment and force application is impractical. Optionally, offset adjusters 150 may be disposed in any region of the probe card assembly 104 where desired.

Figure 2:
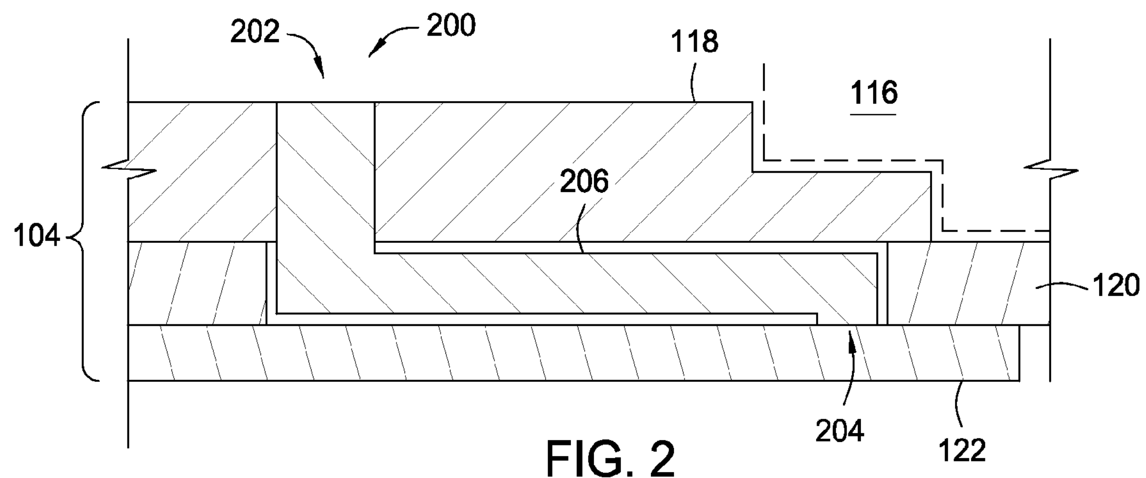
FIG. 2 is a schematic view of the offset adjuster of FIG. 1.

FIG. 2 depicts a close-up of the probe card assembly 104, showing a simplified, schematic view of one embodiment of an offset adjuster 200 similar to the offset adjuster 150 of FIG. 1. As shown in FIG. 2, the offset adjuster 200 includes a force adjustment portion 202 and a force application portion 204 coupled together by a mechanism, such as a beam 206. The force adjustment portion 202 is accessible from an upper side of the probe card assembly 104, such that adjustments to the force to be applied may be provided in a location that is offset from (i.e., not axially aligned with) the location where the force is to be applied (i.e., at the force application portion 204). In one embodiment, the force adjustment portion 202 is disposed in a region of the test system 100 clear of the keep out area 116 while the force application portion 204 is disposed in a region proximate to, or below, the keep out area 116.

The force adjustment portion 202 may comprise any suitable mechanical, electromechanical, electrical, or thermal device, combinations thereof, or the like. For example, the force adjustment portion 202 may comprise a screw, a differential screw, a cam, a lever, a wedge, a gear, or like device (e.g., a simple machine) that may be actuated mechanically (such as by a driver, a wrench, a lever, or the like), electrically (such as by a motor, stepper motor, or the like), piezoelectrically, thermally, or by combinations thereof, and the like. Moreover, adjustments made to the offset adjuster 200 may be made manually or may be automated and/or controlled (for example, via the controller 110).

The force adjustment portion 202 may be coupled to the force application portion 204 by any suitable mechanism. The mechanism is generally sufficiently rigid to minimize deflection due to the force applied by the force application portion 204 and is configured to withstand any lateral forces that may be applied to the offset adjuster 200 during any lateral alignment of the probe substrate 122. In one embodiment, the mechanism is a beam 206. The mechanism may further comprise a flexible coupling disposed between the mechanism and either or both of the force adjustment portion 202 and the force application portion 204. The flexible coupling may comprise a flexure, a spring, a hinge, or the like. The flexible coupling may be configured to provide a single rotational degree of freedom of movement.

The force application portion 204 can be configured to apply a force to a desired location on the probe substrate 122 in order to assist in the planarization thereof. The force application portion 204 may directly contact the probe substrate 122 or may interface with a feature disposed on the probe substrate 122, such as a stud (not shown). Alternatively, the force applied by the force application portion 204 may be transferred through intervening components or layers (not shown).

The offset adjuster 200 may be fabricated from suitable materials capable of generating and withstanding the forces required to planarize and/or laterally adjust the probe card assembly 104. Examples of suitable materials include, metals, plastics, resins, and the like, or combinations thereof. In one embodiment, the offset adjuster 200 is fabricated from titanium. The offset adjuster 200 depicted in FIG. 2 is greatly simplified for illustrative purposes and other configurations are contemplated that suitably apply the desired force to the probe substrate 122. For example, the relative locations of the force adjustment portion 202, the force application portion 204, and the beam 206 may be different from that as shown in FIG. 2.

Returning to FIG. 1, each axial adjuster 160 has a force adjustment portion 162 that is axially aligned with a force application portion 164 along an axis perpendicular to the probe card assembly 104. The axial adjusters 160 are generally positioned in a location such that the force adjustment portions 162 are accessible when the probe card assembly 104 is installed in the test system 100 (i.e., not proximate the keepout area 116). Optionally, axial adjusters 160 may be disposed in regions of the probe card assembly 104 proximate the keep out area 116. However, the ability to adjust the planarity of the probe substrate 122 after installation into the test system 100 using such axial adjusters would be eliminated. Examples of suitable axial adjusters 160 include screws, differential screws, and the like. The force adjustment portion 162 of the axial adjusters 160 may be configured and controlled as described above with respect to the force adjustment portion 152 of the offset adjusters 150.

Figure 3:
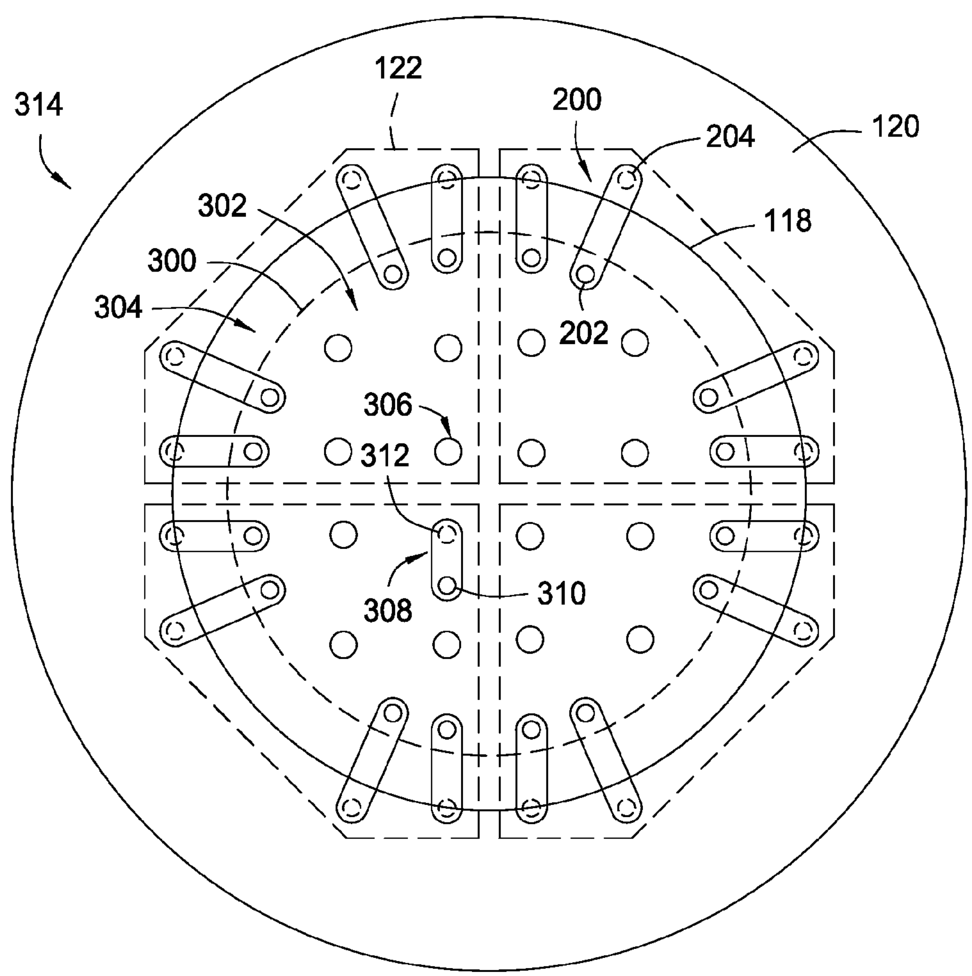
FIG. 3 is a plan view of a probe card assembly according to some embodiments of the present invention.

It is contemplated that one or more offset adjusters 150 may be utilized alone or in combination with one or more axial adjusters 160 in order to planarize the plurality of probes 138 of the probe card assembly 104 in regions that may be inaccessible using conventional designs. For example, FIG. 3 depicts a top view of a probe card assembly 314 utilizing a plurality of offset adjusters 200 and axial adjusters 306. In the embodiment described in FIG. 3, the probe card assembly 314 illustratively includes a substrate 118 coupled to a wiring substrate 120 having a plurality of probe substrates 122 disposed on a lower surface thereof. A plurality of axial adjusters 306 are provided for applying a desired force to the plurality of probe substrates 122 in order to assist in planarizing the plurality of probes (not shown) extending from the probe substrate 122. Each axial adjuster 306 generally includes an adjustment portion that is axially aligned with the force application portion, as described above with respect to FIG. 1. Each of the axial adjusters 306 are disposed within an interior region 302 defined by a boundary 300 that corresponds to an area accessible within the test system 100 (i.e., outside of the keep-out areas 116). Although FIG. 3 illustrates fifteen axial adjusters 306 and seventeen offset adjusters 200, more or fewer of each type of adjuster could be used.

A plurality of offset adjusters 200 may be provided to allow for applying desired planarizing forces to portions of the probe substrate 122 that are disposed in an exterior region 304 corresponding to the keep-out region 116, described above with respect to FIGS. 1 and 2. As shown, each offset adjuster 200 is positioned such that the adjustment portion 202 is disposed within the interior region 302 and accessible from within the test system 100. The offset adjusters 200 are further positioned such that each force application portion 204 is disposed within the exterior region 304 (where axial adjustment of the force is not possible). Although the offset adjuster 200 may be utilized to span the distance between the interior region 302 and the exterior region 304 to compensate for the keep-out area 116 of the test system 100 described in FIG. 1, it is contemplated that the offset adjuster may be used at any location on the probe card assembly 314 where it is desired to apply a force to the probe substrate 122 in the region that is otherwise inaccessible. For example, an offset adjuster 308 may be provided having a force adjustment portion 310 and a force application portion 312 disposed completely within the interior region 302.

Figure 4:
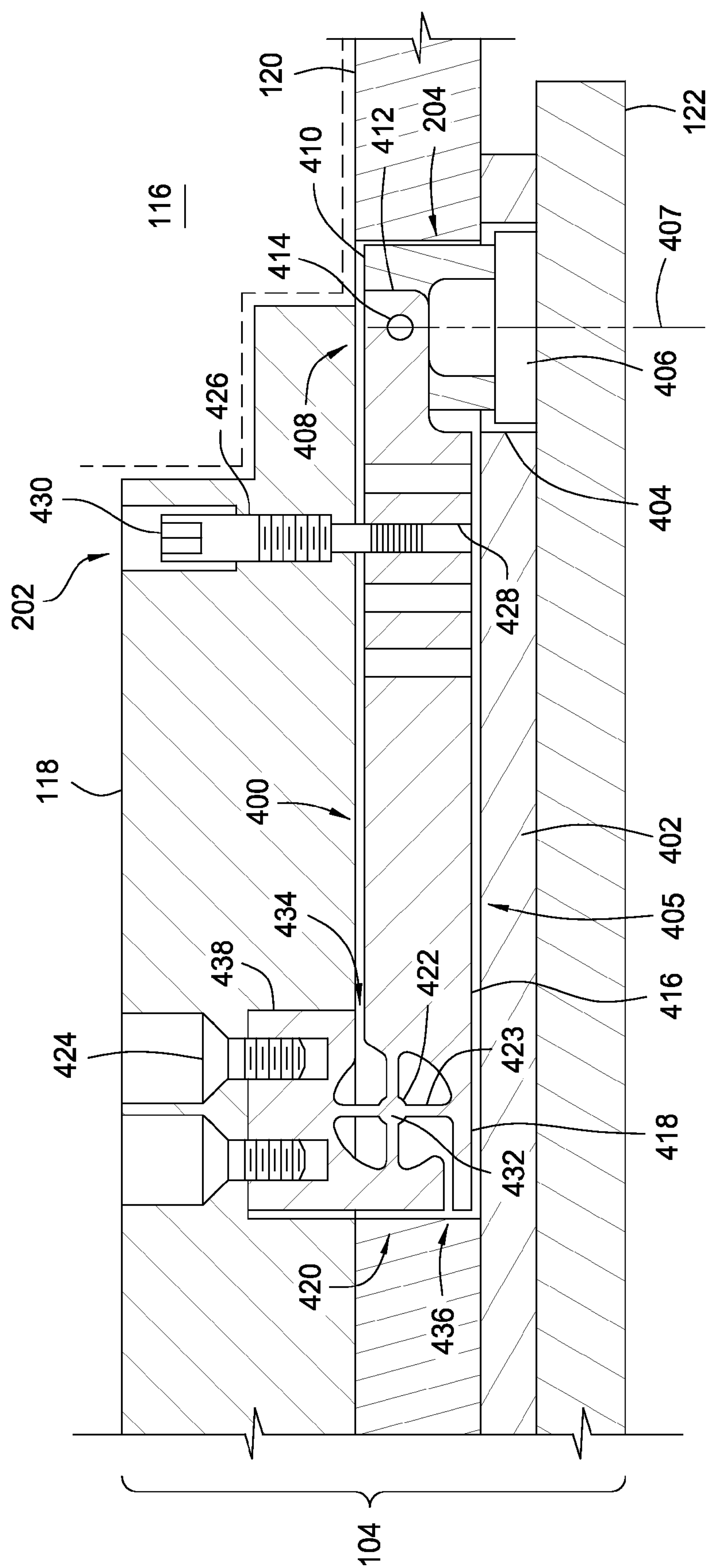
FIG. 4 is a side view of an offset adjuster according to some embodiments of the present invention.

Offset adjusters as described above with respect to FIGS. 1-3 may take many forms for providing the benefits described herein. For example, FIG. 4 depicts one embodiment of an offset adjuster 400 having a beam 416 coupling the force adjustment portion 202 to the force application portion 204. The beam 416 is flexibly secured to and disposed within the probe card assembly 104. For example, the beam 416 may be coupled to the substrate 118 by a base 438 proximate a first end 418 of the beam 416, and may reside in a slot 405 in the wiring substrate 120. The base 438 may be coupled to the probe card assembly 104 in any suitable manner, such as by gluing, bonding, welding, screwing, bolting, or the like. In one embodiment, the base 438 is disposed in a recess formed in the substrate 118 and is secured thereto by one or more screws 424.

The beam 416 may be flexibly secured to the base 438 by a flexible coupling disposed between the beam 416 and the base 438. The flexible coupling may be configured to provide a single rotational degree of freedom of movement between the beam 416 and the base 438. The flexible coupling may be any suitable mechanism, such as a hinge, a spring, a flexure, or the like. The beam 416 may be integrally formed the base 438 or the beam 416 may be coupled thereto. In the embodiment depicted in FIG. 4, the beam 416 is integrally formed with the base 438 and is flexible secured thereto by a hinge 420. The hinge 420 may be backlash free to facilitate more accurate control over the force application portion 204. The hinge 420 may further be configured to withstand lateral forces that may be applied to the hinge 420 during any lateral alignment of the probe substrate 122.

According to some embodiments, the hinge 420 comprises a cartwheel hinge 422 integrally formed in and coupling the base 438 and the beam 416. The cartwheel hinge 422 includes a plurality of flexures 423 radially disposed about an axis 432 to facilitate rotation of the beam 416 about the axis 432. In the embodiment depicted in FIG. 4, four flexures 423 are provided, two each between the axis 432 and the base 438 and between the axis 432 and the beam 416. Optionally, the flexures 432 may be orthogonally aligned and further optionally oriented such that one pair of flexures 432 is parallel with the beam 416 and one pair of flexures 432 is normal to the beam 416. Optionally, one or more gaps 434, 436 having a desired width may be provided between the base 438 and the beam 416 to act as a stop, thereby preventing over-rotation of the beam 416 and reducing the risk of failure of the cartwheel hinge 422.

Figure 5:
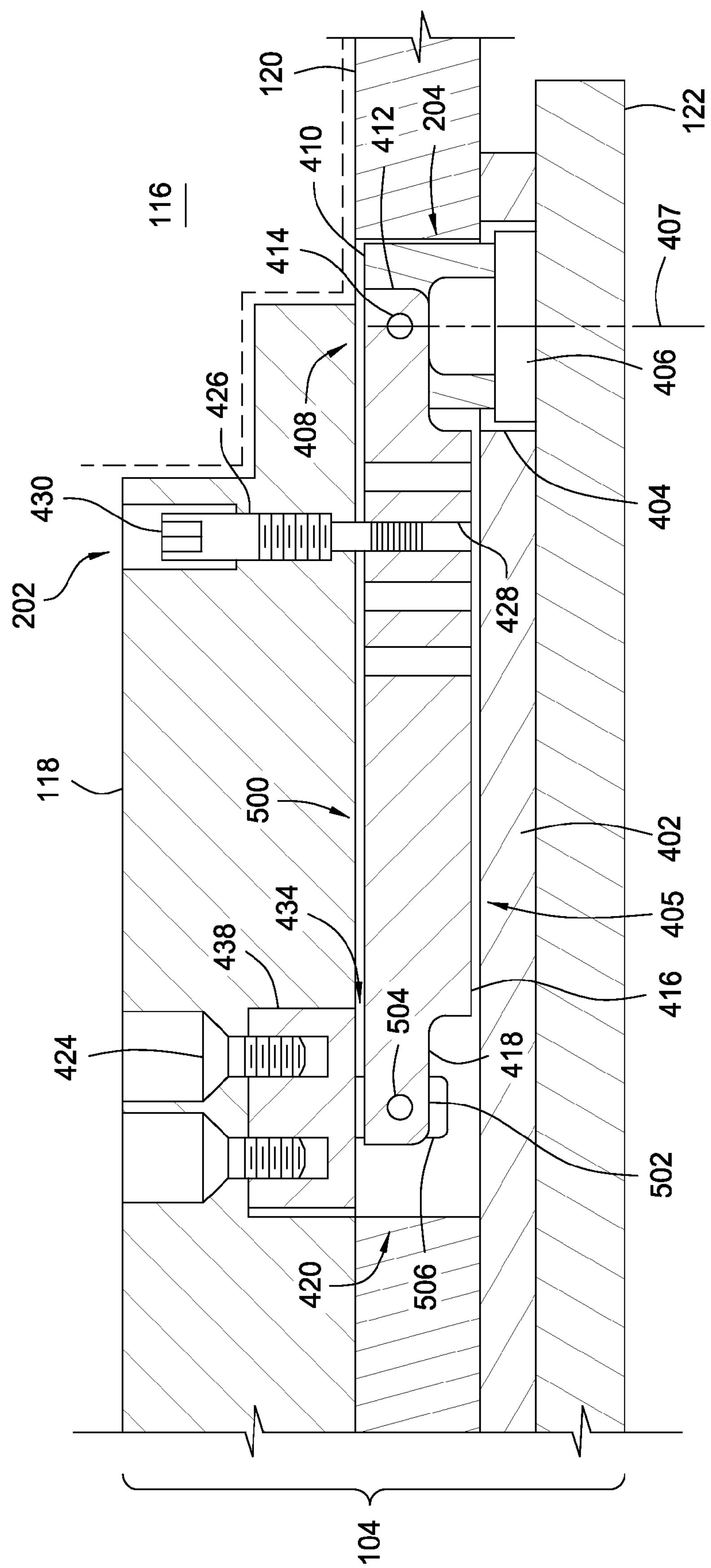
FIG. 5 is a side view of another offset adjuster according to some embodiments of the present invention.

In other embodiments, such as that shown as an offset adjuster 500 in FIG. 5, the hinge 420 may comprise a pin hinge having a pin 504 coupling an extension 502 of the first end 418 of the beam 416 to a protrusion 506 of the base 438. The offset adjuster 500 is otherwise similar to the offset adjuster 400, described with respect to FIG. 4.

Returning to the embodiment depicted in FIG. 4, the force adjustment portion 202 may include a differential screw 426 having a first threaded portion disposed in the substrate 118 and a second threaded portion disposed in a hole 428 formed in the beam 416. Optionally, a plurality of holes 428 may be provided in the beam 416 (such as the four holes 428 depicted in FIG. 4) to facilitate use of the offset adjuster 400 in other regions of the probe card assembly 104 having different desired dimensions between the force adjustment portion 202 and the force application portion 204. The differential screw 426 includes a feature 430 to facilitate controlling the force adjustment portion 202, for example by rotating the differential screw 426 to increase or decrease the force applied by the force application portion 204 of the offset adjuster 400. In one embodiment, the feature 430 comprises a hexagonal recess formed in a head of the differential screw 426 to interface with a hexagonal wrench or driver.

Figure 4A:
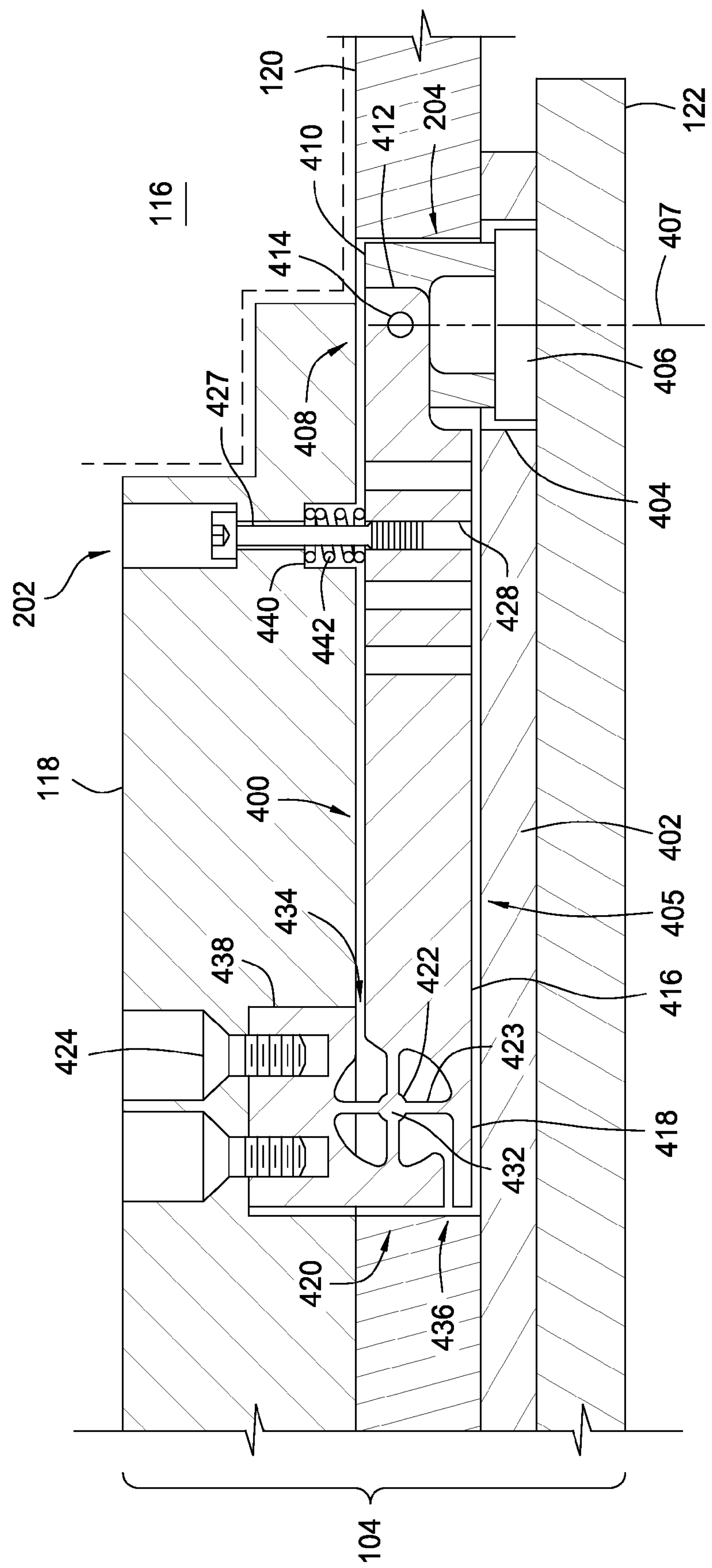

In other embodiments, the force adjustment portion 202 may include a screw 427, as depicted in FIG. 4A. The screw 427 is disposed through the substrate 118 and has a threaded portion disposed in the hole 428 of the beam 416. Optionally, a biasing element may be provided to bias the force application portion 204 in a direction towards the probe substrate 122. In the embodiment depicted in FIG. 4A, the biasing element comprises a spring 442 disposed in a recess 440 formed in a bottom portion of the substrate 118.

According to some embodiments, the force application portion 204 may be generally disposed at a second end 412 of the beam 416, opposite the first end 418. The force application portion 204 may be flexibly coupled to the beam 416 by a mechanism that provides a single rotational degree of freedom of movement between the beam 416 and the force application portion 204, such as a flexure, a hinge, or the like. In the embodiment depicted in FIG. 4, the force application portion 204 includes a cup 410 coupled to the second end 412 by a pin 414, thereby forming a hinge 408 about which the cup 410 may rotate. The cup 410 may interface with a stud 406 coupled to the probe substrate 122. In embodiments where an interposer substrate 402 is present, an opening 404 may be provided in the interposer substrate 402 to allow the stud 406 and/or the cup 410 to extend therethrough without contacting the interposer substrate 402. The hinge 408 advantageously facilitates alignment between the cup 410 and the stud 406 to maximize the axial application of force to the probe substrate 122 (along axis 407) and minimize any torque that may undesirably deform the probe substrate 122 or fracture the bond between the stud 406 and the probe substrate 122.

In operation, the force adjustment portion 202 may be controlled via rotation of the differential screw 426 to rotate the beam 416 about the hinge 420. As the beam 416 rotates, the force application portion 204 applies a greater or lesser force against the probe substrate 122, depending upon the direction of rotation of the beam 416. By adjusting one or more offset adjusters and optionally one or more axial adjusters, the planarity of the probe substrate may be controlled as desired, even in embodiments where the probe substrate extends proximate to or below the keepout area.

Returning to FIG. 1, the support chuck 106 is disposed in the chamber 136 generally opposite the probe card assembly 104. The support chuck 106 is configured to hold one or more electronic devices to be tested, (e.g., the DUT 108). The support chuck 106 may be configured to move the DUT 108 vertically between a lower position (as shown) that is not engaged with the probe card assembly 104 (for example, to facilitate placing the DUT 108 on the support chuck 106) and a raised position to selectively engage the DUT 108 with the probe card assembly 104 (for example to perform testing or burn in of the DUT 108). The support chuck 106 may also be configured to move the DUT 108 horizontally to align the terminals 140 of the DUT with the probes 138 of the probe card assembly 104. For reference herein, the terms vertical and horizontal are utilized to describe relative motion between the probe card assembly 104 and the DUT 108. The motion of the DUT 108 or components of the test system 100 in a direction perpendicular to the surface of the DUT 108 is often referred to as z-motion or z-travel. Motion in a direction that is parallel to the surface of the DUT is often referred to herein as xy-motion or xy-travel.

The test system 100 may further include an adjustment mechanism 103 configured to adjust the position of the probe card assembly 104 with respect to a reference plane of the housing 134. The adjustment mechanism 103 advantageously facilitates compensating for system-to-system variations in the alignment of the probe card assembly 104. For example, due to variations in the respective housings 134 of different test systems, the probe card assemblies 104 disposed the respective housings 134 may be differently aligned. By adjusting the position of the probe card assemblies 104 with respect to a reference plane of the test system (not shown), the adjustment mechanism 103 advantageously reduces or eliminates misalignment of the probe card assemblies 104 due to the system-to-system variation. In the embodiment depicted in FIG. 1, the adjustment mechanism 103 is disposed between the test head 102 and the probe card assembly 104.

The test head 102 is coupled to a controller 110 via one or more communications channels 132 for creating and/or receiving electrical signals utilized in the operation of the test system, as described in more detail below. The controller 110 comprises a central processing unit (CPU) 124, a memory 128, and support circuits 126 for the CPU 124 and facilitates control of the components of the test system 100, as discussed below in further detail. The controller 110 may be one of any form of general-purpose computer processor that can be used in an industrial setting for controlling various chambers and sub-processors. The memory 128 of the controller 110 may be one or more of readily available memory such as random access memory (RAM), read only memory (ROM), floppy disk, hard disk, or any other form of digital storage, local or remote. The support circuits 126 are coupled to the CPU 350 for supporting the processor in a conventional manner. These circuits include cache, power supplies, clock circuits, input/output circuitry and subsystems, and the like. Instructions for operating and controlling the test system 100 are generally stored in the memory 128 or other computer-readable medium accessible to the CPU 124, for example as a software routine 130.

The communications channels 132 are generally provided from the controller 110 to the test head 102, and ultimately, to the probe card assembly 114. The communications channels 132 can comprise any element or elements, device or devices, or the like, that can provide for communication between the controller 110, the test head 102, and the probe card assembly 114, for the passage of power and signals (e.g., test signals, control signals, and the like) between the test system 100 and the DUT 108. The communications channels 132 can be formed by one or more coaxial cables, fiber optic cables, wireless communications links, and the like, as well as electronics such as, receiver circuits, driver circuits, interface circuits, and the like.

In operation, a DUT 108 is placed on the support chuck 106. The support chuck 106 can then be moved such that the input and/or output terminals 140 of the DUT 108 are brought into contact with contact tips of the probes 138, thereby establishing temporary electrical connections between the terminals 140 and the probes 138. The test head 102, as generally directed by the controller 110, can then generate power and test signals that are provided through the probe card assembly 104 to the DUT 108. Response signals generated by the DUT 108 in response to the test signals are similarly carried through the probe card assembly 104 to the test head 102 and controller 110, which may then analyze the response signals and determine whether the DUT 108 responded correctly to the test signals.

In some embodiments, there may be fewer probes 138 than terminals 140. In such a case, the support chuck 106 can move the DUT 108 such that other terminals 140 are brought into contact with the probes 138 at which time the test head 102 can provide power and test signals through the probe card assembly 104 to test other portions of the DUT 108. The foregoing process of bringing the terminals 140 into contact with the probes 138 and then testing a portion of the DUT 108 can be repeated as needed to test the entire DUT 108. For example, if DUT 108 is a semiconductor wafer comprising a plurality of semiconductor dies (not shown), the wafer can be repositioned multiple times, as needed, in order to test all of the dies of the wafer.

Figure 6:
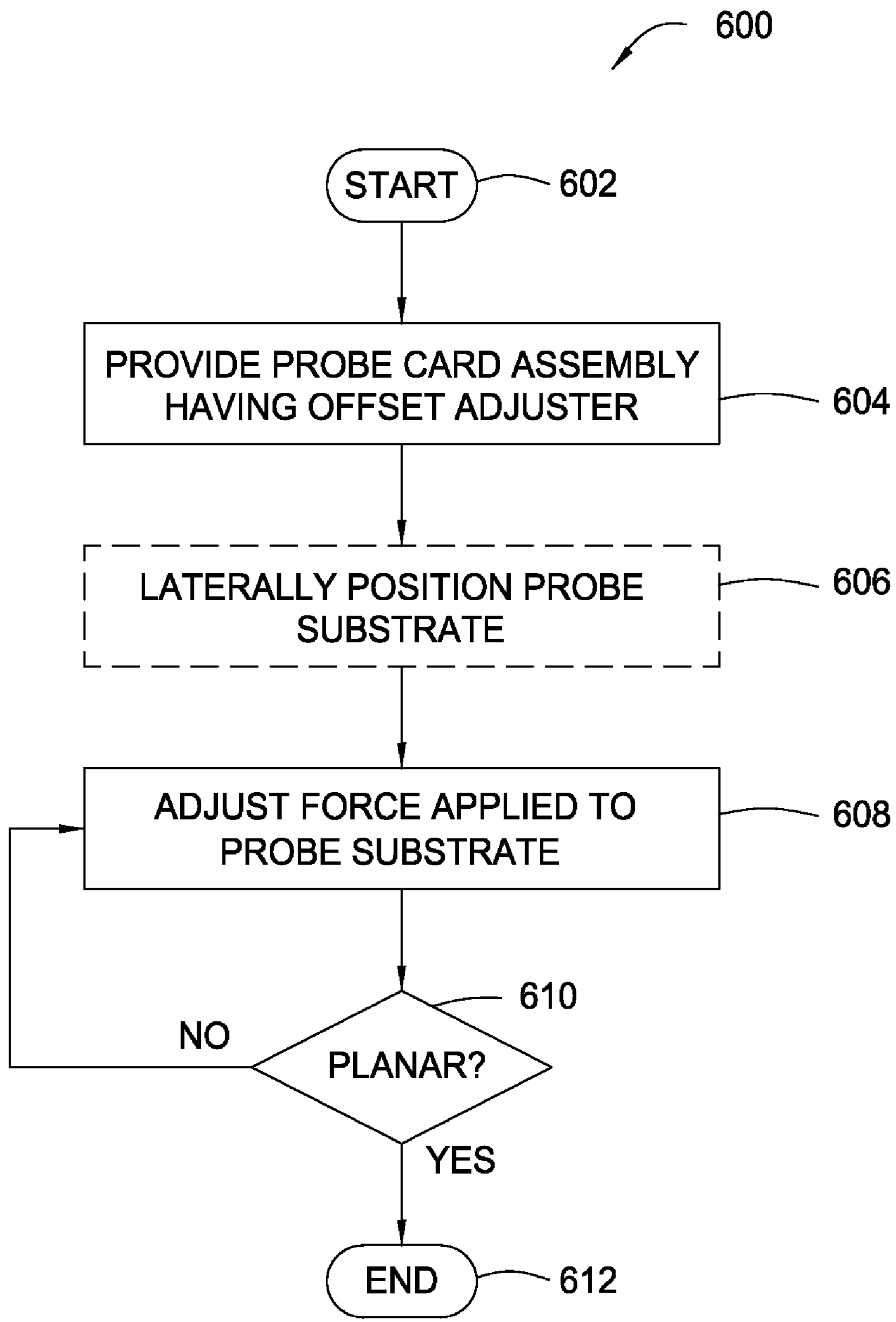
FIG. 6 is a flow chart depicting a method of adjusting a probe card assembly according to some embodiments of the present invention.

FIG. 6 depicts one embodiment of a method 600 according to some embodiments for planarizing a probe substrate of a probe card assembly utilizing one or more offset adjusters, as described above. The method 600 is described with respect to the embodiment depicted in FIG. 1. The method 600 begins at step 602 and proceeds to step 604 wherein a probe card assembly 104 having at least one offset adjuster 150 is provided. The force application portion 154 of the offset adjuster 150 is directly or indirectly in contact with the probe substrate 122 to provide a controllable force at a desired location on the probe substrate 122. Optionally, the probe card assembly 104 may further comprise at least one axial adjuster 160.

Next, at step 606, the probe substrate 122 may optionally be laterally positioned with respect to the remainder of the probe card assembly 104 (e.g., the wiring substrate 120, the substrate 118, or the like). Step 606 may include loosening the connections (e.g., screws) coupling the probe substrate 122 to the wiring substrate 120 sufficiently to allow controlled lateral movement of the probe substrate 122. Upon laterally positioning the probe substrate 122 in a desired location, the screws or other fasteners may be tightened to lock the probe substrate 122 in place.

Next, at step 608, the force applied to the probe substrate 122 may be adjusted as desired to control the planarization of the probe substrate 122. The force applied to the probe substrate 122 is controlled by adjusting the force adjustment portion 152 of the offset adjuster 150 to apply the desired force via the force application portion 154 of the offset adjuster 150. For example, with respect to FIGS. 4 and 5, the differential screw 426 may be rotated to apply a greater or lesser force against the probe substrate 122. Optionally, a plurality of offset adjusters and axial adjusters may be utilized, for example as depicted in FIG. 3, to apply planarizing forces at a plurality of desired locations along the probe substrate or plural probe substrates in order to planarize the respective tips of the probes extending therefrom as described above.

Next, at step 610, the planarity of the probe substrate 122 is determined and compared to the desired planarity tolerance. If the probe substrate 122 is suitably planar, the method ends at step 612. If the probe substrate 122 does not have the desired planarity, the method returns to step 608, where the force applied to desired locations of the probe substrate 122 may be further adjusted. The iteration of adjustments to one or more offset adjusters and, optionally, one or more axial adjusters may be repeated as required to contour the probe substrate to establish a desired level of planarity of the plurality of probes extending therefrom. Although the method of planarization described above discloses adjusting one or more forces applied to the probe substrate, it is contemplated that the force may be applied to any component of the probe card assembly that is configured to affect the planarity of the plurality of probes, as described above. It is further contemplated that the apparatus and methods described herein may be utilized to shape the probe substrates into desired contours other than planar. It is further contemplated that the method of planarization may be performed on a test stand remote from the test system, or while the probe card assembly is installed in the test system.

Thus, an inventive method and apparatus for offset, or indirect planarization of a substrate has been provided herein. The apparatus and methods disclosed herein advantageously provide for planarization of a substrate in locations where the axial alignment of conventional adjustment mechanisms are not practical or possible to utilize due to test system configurations (e.g., proximate keepout areas). Moreover, the inventive methods and apparatus allow for the extension of existing test equipment to test larger substrates previously not possible due to the equipment physical specifications and limitations imposed upon the probe card assemblies used therein. While the present invention has been described with respect to planarizing probe card assemblies in semiconductor device test systems, it is contemplated that the present invention may be advantageously utilized in other applications where indirect planarization of a substrate is desirable.

While the foregoing is directed to embodiments of the present invention, other and further embodiments of the invention may be devised without departing from the basic scope thereof, and the scope thereof is determined by the claims that follow.

The invention claimed is:

1. An apparatus for indirectly planarizing a probe card assembly, comprising:

an adjustment portion for controlling a force applied to a probe substrate of the probe card assembly, the probe substrate having probes extending from a surface of the probe substrate;

a force application portion configured to apply the force to the probe substrate at a location that is laterally offset from an axis perpendicular to the surface of the probe substrate and passing through the adjustment portion without applying the force to a location of the probe substrate that is on the axis; and a mechanism coupling the force from the adjustment portion to the force application portion.

2. The apparatus of claim 1, wherein the mechanism comprises a beam.

3. The apparatus of claim 2, further comprising a flexible coupling disposed between the beam and a base for securing the beam to a reference location.

4. The apparatus of claim 3, wherein the flexible coupling has a single rotational degree of freedom.

5. The apparatus of claim 3, wherein the flexible coupling comprises a flexure, a spring, or a hinge.

6. The apparatus of claim 3, further comprising at least one stop configured to limit the movement of at least one of the flexible coupling or the beam.

7. The apparatus of claim 3, wherein the flexible coupling is backlash free.

8. The apparatus of claim 3, wherein the flexible coupling can withstand lateral forces applied to the apparatus.

9. An apparatus for indirectly planarizing a probe card assembly, comprising:

an adjustment portion for controlling a force applied to a probe substrate of the probe card assembly;

a force application portion configured to apply the force to the probe substrate at a location that is laterally offset from one side of the adjustment portion;

a mechanism coupling the adjustment portion to the force application portion, wherein the mechanism comprises a beam; and a flexible coupling disposed between the beam and a base for securing the beam to a reference location, wherein the flexible coupling can withstand lateral forces applied to the apparatus, and wherein the flexible coupling comprises a cartwheel hinge having at least one flexure configured to absorb lateral forces applied to the apparatus.

10. The apparatus of claim 2, further comprising a flexible coupling disposed between the beam and the force application portion.

11. The apparatus of claim 10, wherein the flexible coupling has a single rotational degree of freedom.

12. The apparatus of claim 1, wherein the adjustment portion comprises at least one of a screw, a differential screw, a gear, a cam, a wedge, or a lever.

13. The apparatus of claim 12, further comprising an actuator for controlling the adjustment portion.

14. The apparatus of claim 13, wherein the actuator is driven electrically, piezoelectrically, thermally, or purely mechanically.

15. The apparatus of claim 1, wherein the force application portion further comprises a feature configured to interface with a surface against which the force is to be applied.

16. An apparatus for indirectly planarizing a probe card assembly, comprising:

an adjustment portion for controlling a force applied to a probe substrate of the probe card assembly;

a force application portion configured to apply the force to the probe substrate at a location that is laterally offset from one side of the adjustment portion; and a mechanism coupling the adjustment portion to the force application portion wherein the force application portion further comprises a feature configured to interface with a surface against which the force is to be applied, wherein the feature is a recess formed in the force application portion configured to fit over a mating protrusion disposed on the surface.

17. The apparatus of claim 2, wherein the beam is flexibly coupled to a base.

18. The apparatus of claim 2, wherein the beam further comprises a plurality of threaded holes disposed at different locations along the length of the beam to provide different sites to interface with the adjustment portion.

19. A probe card assembly for testing a semiconductor, comprising:

an upper portion configured to interface with a tester, the upper portion sized to fit within an interior area of the tester defined and bounded by a keepout area;

a lower portion coupled to the upper portion and having a probe interface disposed on a bottom surface of the lower portion, the lower portion larger than the interior area defined by the keepout; and an offset adjuster for planarizing the bottom surface of the lower portion, the offset adjuster comprising:

an adjustment portion for controlling a force applied to a probe substrate of the probe card assembly, wherein the lower portion comprises the probe substrate;

a force application portion configured to apply the force to the probe substrate at a location that is laterally offset from an axis perpendicular to the bottom surface and passing through the adjustment portion without applying the force to a location of the probe substrate that is on the axis; and a mechanism coupling the force from the adjustment portion to the force application portion;

the adjustment portion having access from the upper portion within the interior area; and wherein the force application portion applies the force in response to control of the adjustment portion.

20. The apparatus of claim 19, wherein the force application portion is at least partially disposed below the keepout area.

21. The apparatus of claim 19, further comprising a plurality of offset adjusters.

22. The apparatus of claim 19, wherein the lower portion of the probe card assembly comprises a wiring substrate, an interposer, and a probe substrate.

23. The apparatus of claim 19, wherein the mechanism comprises a beam.

24. The apparatus of claim 23, wherein the beam is flexibly coupled to a base.

25. The apparatus of claim 23, wherein the beam further comprises a plurality of threaded holes disposed at different locations along the length of the beam to provide different sites to interface with the adjustment portion.

26. The apparatus of claim 23, further comprising a flexible coupling disposed between the beam and a base for securing the beam to a reference location.

27. The apparatus of claim 26, wherein the flexible coupling has a single rotational degree of freedom.

28. The apparatus of claim 26, wherein the flexible coupling comprises a flexure, a spring, or a hinge.

29. The apparatus of claim 26, further comprising at least one stop configured to limit the movement of at least one of the flexible coupling or the beam.

30. The apparatus of claim 26, wherein the flexible coupling is backlash free.

31. The apparatus of claim 26, wherein the flexible coupling can withstand lateral forces applied to the apparatus.

32. The apparatus of claim 31, wherein the flexible coupling comprises a cartwheel hinge having at least one flexure configured to absorb lateral forces applied to the apparatus.

33. The apparatus of claim 19, further comprising a flexible coupling disposed between the beam and the force application portion.

34. The apparatus of claim 33, wherein the flexible coupling has a single rotational degree of freedom.

35. The apparatus of claim 19, wherein the adjustment portion comprises at least one of a screw, a differential screw, a gear, a cam, a wedge, or a lever.

36. The apparatus of claim 35, further comprising an actuator for controlling the adjustment portion.

37. The apparatus of claim 36, wherein the actuator is driven electrically, piezoelectrically, thermally, or purely mechanically.

38. The apparatus of claim 19, wherein the force application portion further comprises a feature configured to interface with an opposing surface to which the force is to be applied.

39. The apparatus of claim 38, wherein the feature is a recess formed in the force application portion configured to fit over a mating protrusion disposed on the opposing surface.

40. The apparatus of claim 1, wherein:

the mechanism comprises a beam disposed between the adjustment portion and the probe substrate, and a first hinge rotatably coupling a first end of the beam to the probe substrate; and the adjustment portion is configured to selectively rotate the beam about the first hinge.

41. The apparatus of claim 40 further comprising a substrate, the beam being disposed between the substrate and the probe substrate, wherein:

the mechanism further comprises a second hinge that rotatably couples a second end of the beam opposite the first end to the substrate; and the adjustment portion is further configured to selectively rotate the beam about the second hinge.

42. The apparatus of claim 41, wherein the adjustment portion comprises a screw configured to apply a force to a location of the beam between the first end and the second end.

43. The apparatus of claim 1, wherein:

the adjustment portion is adjustable to selectively set a level of the force, and substantially all of the level of the force set by the adjustment portion is coupled by the mechanism to the force application portion.

* * * * *